United States Patent
Yanagisawa

(10) Patent No.: US 10,285,294 B2
(45) Date of Patent: May 7, 2019

(54) METHOD FOR PRODUCING A CHASSIS MEMBER USABLE IN A CHASSIS OF AN ELECTRONIC DEVICE

(71) Applicant: LENOVO (SINGAPORE) PTE. LTD., Singapore (SG)

(72) Inventor: Tsunenori Yanagisawa, Kanagawa-ken (JP)

(73) Assignee: LENOVO (SINGAPORE) PTE LTD, Singapore (SG)

( * ) Notice: Subject to any disclaimer, the term of this patent is extended or adjusted under 35 U.S.C. 154(b) by 20 days.

(21) Appl. No.: 15/435,061

(22) Filed: Feb. 16, 2017

(65) Prior Publication Data

US 2017/0235336 A1 Aug. 17, 2017

(30) Foreign Application Priority Data

Feb. 16, 2016 (JP) .................. 2016-026773

(51) Int. Cl.

| | |
|---|---|
| *H05K 5/04* | (2006.01) |
| *C25D 11/04* | (2006.01) |
| *C25D 11/18* | (2006.01) |
| *C25D 11/02* | (2006.01) |
| *C23F 15/00* | (2006.01) |
| *C25D 11/16* | (2006.01) |
| *G06F 1/18* | (2006.01) |
| *H05K 5/00* | (2006.01) |
| *H01L 33/48* | (2010.01) |

(Continued)

(52) U.S. Cl.
CPC .............. *H05K 5/04* (2013.01); *C23F 1/00* (2013.01); *C23F 15/00* (2013.01); *C25D 11/02* (2013.01); *C25D 11/04* (2013.01); *C25D 11/16* (2013.01); *C25D 11/18* (2013.01); *G06F 1/1616* (2013.01); *G06F 1/1656* (2013.01); *G06F 1/18* (2013.01); *H01L 33/483* (2013.01); *H05K 5/00* (2013.01); *H05K 5/0091* (2013.01)

(58) Field of Classification Search
None
See application file for complete search history.

(56) References Cited

U.S. PATENT DOCUMENTS

| | | |
|---|---|---|
| 2,990,300 A | 6/1961 | Paskell |
| 4,444,628 A | 4/1984 | Furukawa et al. |
| | (Continued) | |

FOREIGN PATENT DOCUMENTS

| | | |
|---|---|---|
| JP | 11-135081 | 5/1999 |
| JP | 2000-273563 | 10/2000 |
| | (Continued) | |

OTHER PUBLICATIONS

Kazunori Kobayashi "Technical Trends in Aluminum Alloy Sheets and Plates for IT and Electric Instruments" R&D Kobe Steel Engineering Reports Kobe Steel, Ltd. Dec. 16, 2008, vol. 58 No. 3 p. 18-22.

*Primary Examiner* — Jiong-Ping Lu
(74) *Attorney, Agent, or Firm* — Russell Ng PLLC; Antony P. Ng

(57) ABSTRACT

A chassis member for a chassis of an electronic device is disclosed. The chassis member includes an aluminum alloy layer and an alumite layer serving as an outermost layer of the chassis member and disposed on a surface of the aluminum alloy layer. A grain size of an aluminum alloy in the aluminum alloy layer is between 40 μm and 50 μm.

10 Claims, 4 Drawing Sheets

(51) Int. Cl.
*C23F 1/00* (2006.01)
*G06F 1/16* (2006.01)

(56) References Cited

U.S. PATENT DOCUMENTS

| | | | |
|---|---|---|---|
| 5,723,221 A | 3/1998 | Brooker et al. | |
| 6,322,689 B1 | 11/2001 | Omasa | |
| 2004/0258857 A1 | 12/2004 | Dagan et al. | |
| 2011/0056836 A1* | 3/2011 | Tatebe | C25D 11/16 |
| | | | 205/50 |

FOREIGN PATENT DOCUMENTS

| | | |
|---|---|---|
| JP | 2000286565 A | 10/2000 |
| JP | 2004-124219 | 4/2004 |
| JP | 2005-187856 | 7/2005 |
| JP | 2009-209426 | 9/2009 |
| JP | 2009262530 A | 11/2009 |
| JP | 2010-228279 A | 10/2010 |
| JP | 2013-503973 | 2/2013 |
| JP | 2015-196867 | 11/2015 |
| WO | 2011-028392 | 3/2011 |

\* cited by examiner

METHOD FOR PRODUCING A CHASSIS MEMBER USABLE IN A CHASSIS OF AN ELECTRONIC DEVICE

PRIORITY CLAIM

The present application claims benefit of priority under 35 U.S.C. §§ 120, 365 to the previously filed Japanese Patent Application No. JP2016-026773 with a priority date of Feb. 16, 2016, which is incorporated by reference herein.

TECHNICAL FIELD

The present invention relates to chassis for electronic devices in general, and in particular to a chassis member usable in a chassis of an electronic device.

BACKGROUND

Chassis of modern electronic devices, such as laptop personal computers (laptop PCs), tablet personal computers (tablet PCs), smartphones, and cellular phones, tend to require some level of aesthetic designs. As such, various techniques have been developed to produce a chassis member with a refined depth in appearance, such as by sequentially subjecting an aluminum alloy member to sand blasting, alumite treatment, and clear coating.

However, those techniques for producing a chassis member, such as sand blasting, alumite treatment, and clear coating, are relatively expensive. Thus, it is not economical to employ those techniques to mass produce chassis members with aesthetic designs.

Consequently, it would be preferable to provide a more economical method for mass producing chassis members with aesthetic designs.

SUMMARY

In accordance with an embodiment of the present disclosure, a surface of an aluminum alloy substrate is etched. An alumite treatment is then performed on the surface of the aluminum alloy substrate to form an alumite layer on the surface of the aluminum alloy substrate. The alumite layer is polished to allow the polished alumite layer to be used as an outermost layer of a chassis member of an electronic device.

All features and advantages of the present disclosure will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION

I. Configuration of an Electronic Device

Figure 1:
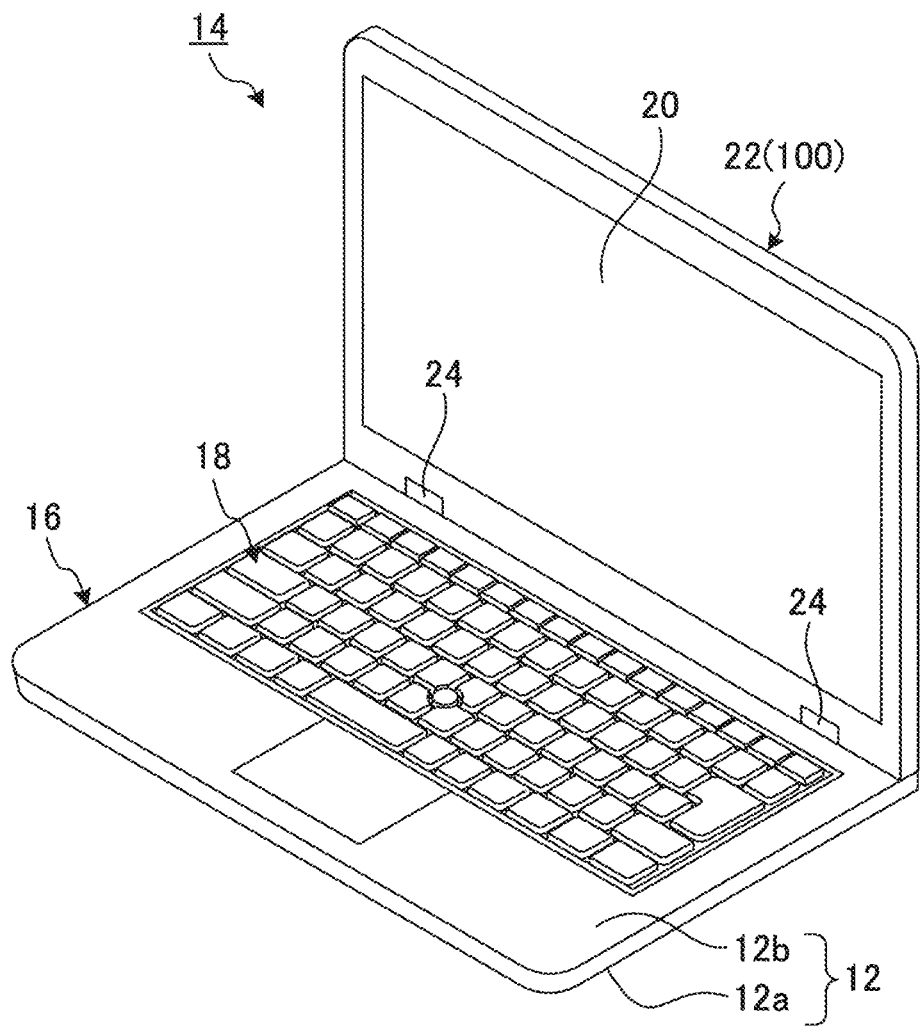
FIG. 1 is a perspective view of an electronic device having a chassis using a chassis member, according to one embodiment.

FIG. 1 is a perspective view of an electronic device 14 having a lid 22 that employs a chassis member 100, according to one embodiment of the present invention, As shown, the electronic device 14 includes a device body (body chassis) 16 having a keyboard device 18 and a rectangular plate-shaped lid (display chassis) 22 having a display device 20. The electronic device 14 is of a clamshell type in which the lid 22 is coupled to the device body 16 with hinges 24 to be freely opened and closed.

The device body 16 includes a chassis 12 having a rear cover 12a and a front cover 12b. The chassis 12 may house well-known electronic components such as a processor, a storage device, etc. The rear cover 12a is a cover member covering side surfaces and a rear surface of the device body 16. The front cover 12b is a resin cover member covering a front surface (upper surface) of the device body 16, and a keyboard device 18 is disposed on a center of the front cover 12b. The lid 22 is electrically connected to the device body 16 by an unillustrated cable passing through the hinges 24. The display device 20 is, for example, a liquid crystal display.

II. Configuration of a Chassis Member

Figure 2A:
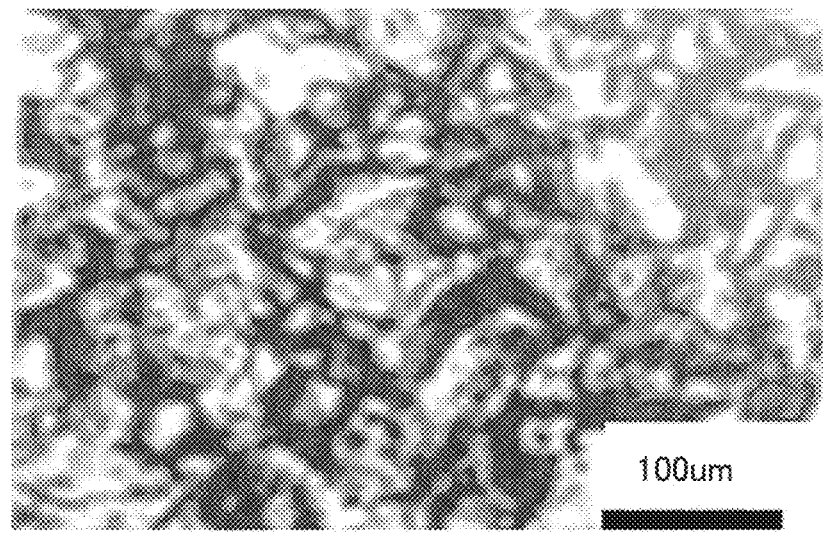
FIGS. 2A-2B are an SEM photograph and a cross-sectional view, respectively, of a chassis member, according to one embodiment.
Figure 2B:
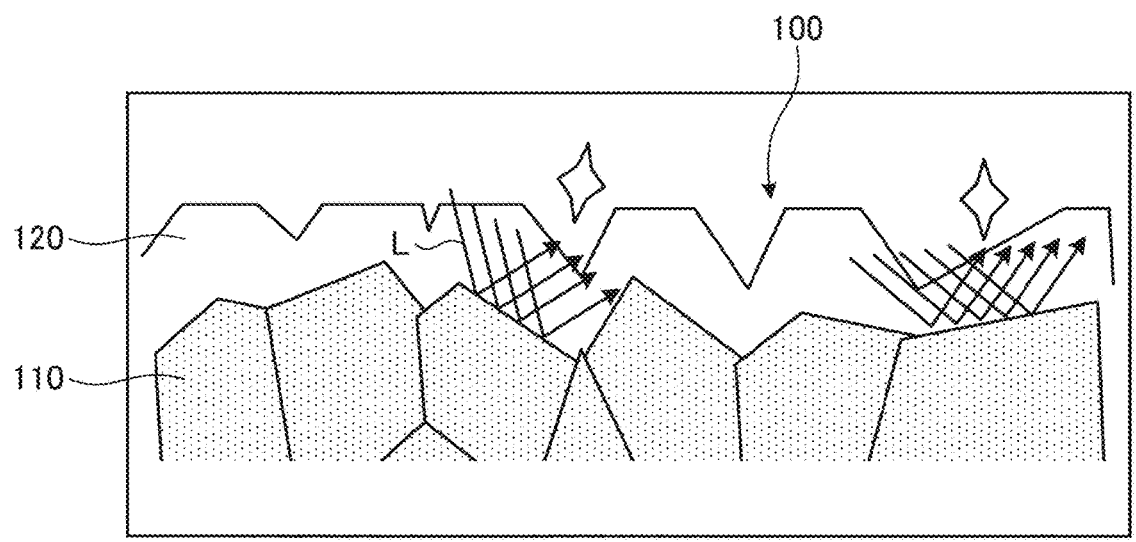
Figure 3A:
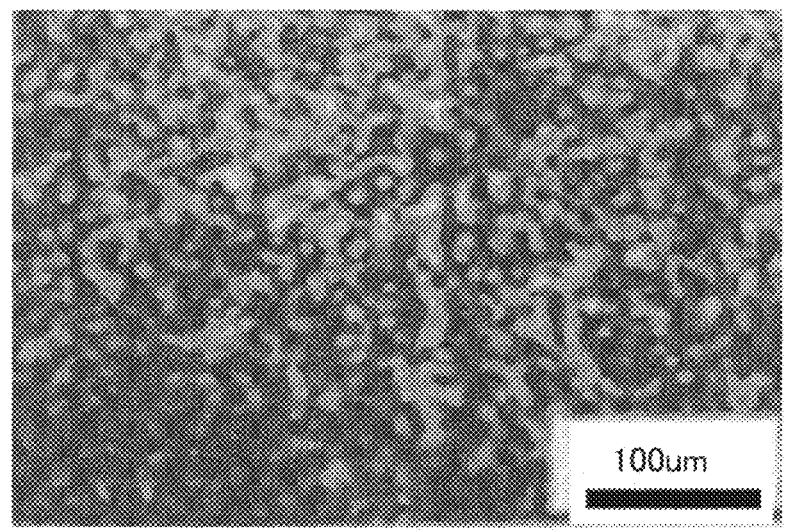
FIGS. 3A-3B are an SEM photograph and a cross-sectional view, respectively, of a conventional chassis member.
Figure 3B:
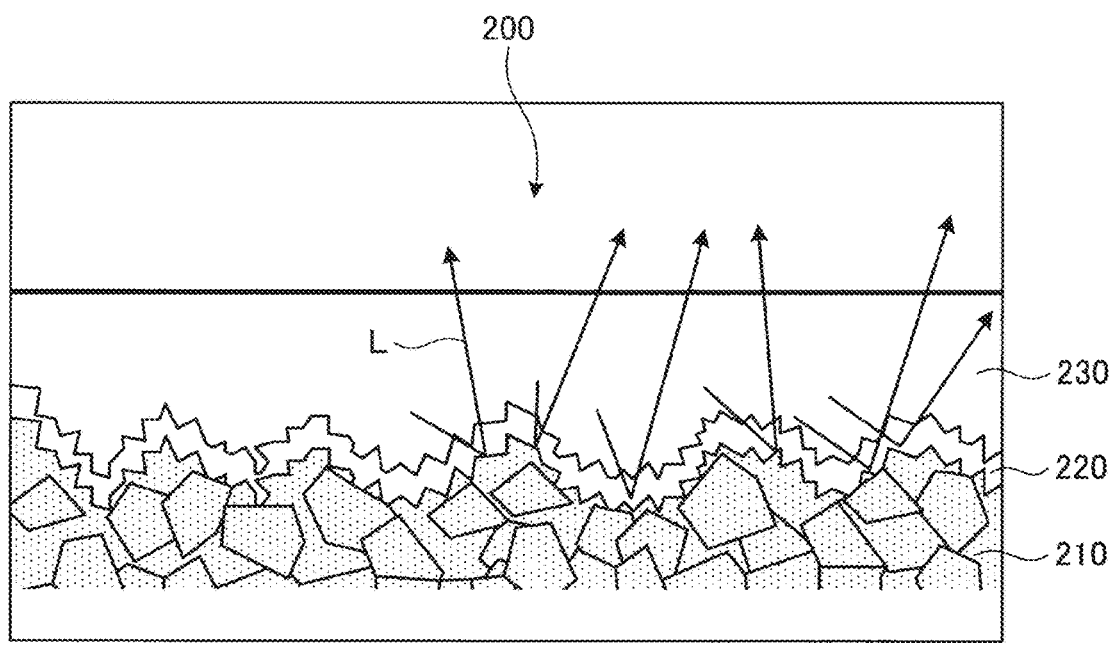

FIGS. 2A-2B are an SEM photograph and a cross-sectional view of a chassis member, respectively, according to one embodiment of the present invention. FIGS. 3A-3B are an SEM photograph and a cross-sectional view of a conventional chassis member, respectively. As illustrated in FIG. 3B, a conventional chassis member 200 includes an aluminum alloy layer 210, an alumite (aluminum oxide) layer 220 formed by an alumite treatment (anodizing) on the aluminum alloy layer 210, and a clear coating layer 230 formed on the alumite layer 220. As illustrated in FIG. 3A, in the conventional chassis member, although the aluminum alloy layer is subjected to sand blasting to have unevenness, the crystal grain size of the aluminum alloy in the aluminum alloy layer is not specifically controlled and is at random in the range less than or equal to 50 µm, for example, resulting in diffuse reflection of a large part of light L incident on chassis member (see FIG. 3B).

On the other hand, as illustrated in FIG. 2B, the chassis member 100 includes an aluminum alloy layer 110 and an alumite layer 120 formed by an alumite treatment on the aluminum alloy layer 110, and the alumite layer 120 is exposed at the outermost surface of the chassis member 100. The aluminum alloy layer 110 of the chassis member 100 has a controlled crystal grain size. For example, an aluminum alloy 5×30 (H material or O material) is utilized for the chassis member 100 according to the embodiment of the present invention. In the 5×30, the crystal grain size of the aluminum alloy in the aluminum alloy layer 110 is controlled to the range from 40 µm to 50 µm, inclusive. In the chassis member 100 having such a configuration, a large proportion of light L (see FIG. 2B) incident on the chassis member is reflected on a flat portion of the aluminum alloy layer, as illustrated in FIG. 2A, so that higher gloss than that obtained in diffuse reflection can be obtained. In addition, the alumite layer is subjected to polishing so that the gross can be further enhanced and an appearance with a developed depth in appearance can be obtained. Furthermore, fingerprints on the outermost surface are inconspicuous, and the outermost surface is protected against scratches.

III. Method for Fabricating a Chassis Member

Figure 4:
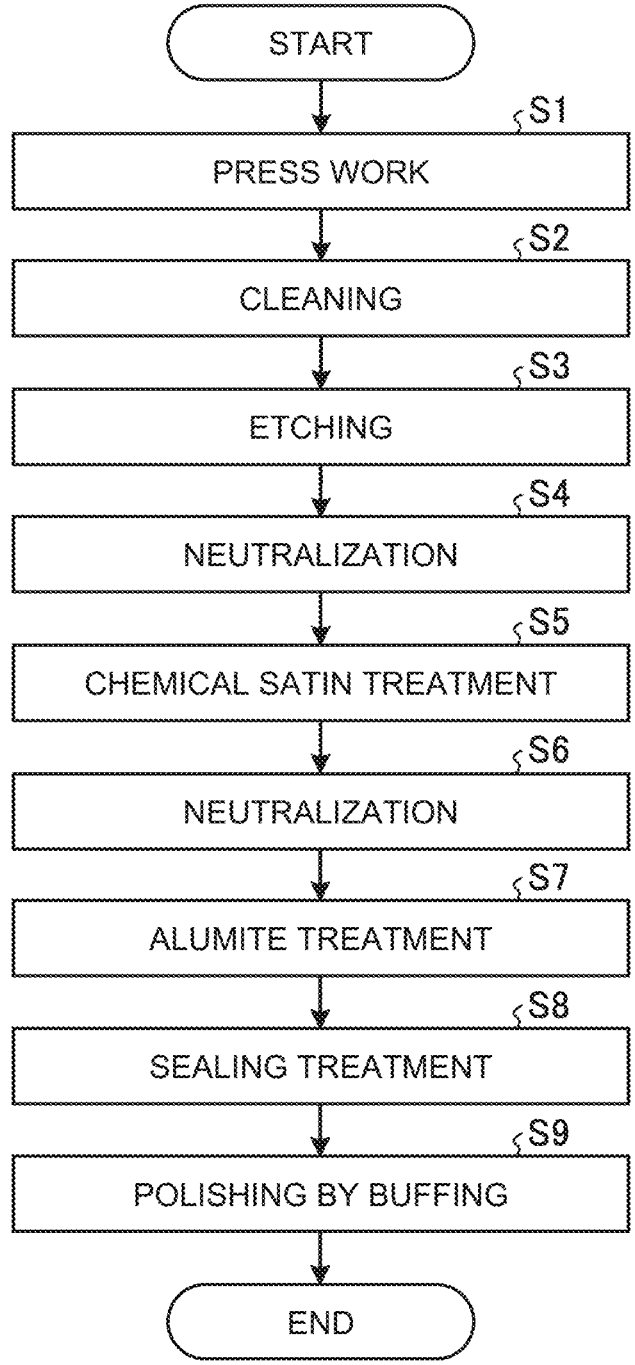
FIG. 4 is a flowchart of a method for producing a chassis member, according to one embodiment.

FIG. 4 is a flowchart of a method for producing a chassis member, in accordance with one embodiment of the present invention. As shown, when producing a chassis member 10, an aluminum alloy substrate of 5×30 is first subjected to press work to conform to the shape of the chassis member 100 (step S1). Next, the surface of the aluminum alloy substrate after the press work is washed using an alkalescent degreasing agent, such as "Top Alcrean 161" manufactured by Okuno Chemical Industries Co., Ltd. (step S2), and it is then etched using an alkaline solution (step S3).

Thereafter, the resulting aluminum alloy substrate 11 is immersed in an acid solution to neutralize the alkaline solution (step S4), and it is then immersed in a make-up solution supplemented with an additive for satin finishing, such as "Alsatin L" manufactured by Okuno Chemical Industries Co., Ltd., so that the surface of the aluminum alloy substrate is subjected to a chemical satin treatment (step S5). In this manner, an aluminum alloy layer according to an embodiment of the present invention is formed on the surface of the aluminum alloy substrate.

Subsequently, the aluminum alloy substrate is immersed in an acid solution to neutralize the additive for satin finishing (step S6), and the surface of the aluminum alloy substrate is then subjected to an alumite treatment, thereby forming an alumite layer on the surface of the aluminum alloy substrate (step S7). if an O material is used as the 5×30, steps S5 and S6 are not performed. Finally, the alumite layer is subjected to a sealing treatment using a sealing material in order to increase corrosion resistance of the alumite layer (step S8) and the surface of the alumite layer is then polished by buffing (step S9).

The above-mentioned steps in the method for producing the chassis member 100 may be modified or changed as long as the following conditions (a) to (d) are satisfied:

(a) sand blasting is performed neither before nor after etching, alumite treatment, and polishing;
(b) clear coating is performed neither before nor after etching, alumite treatment, and polishing;
(c) etching is performed after press work without sand blasting; and
(d) polishing is performed after alumite treatment without clear coating.

As has been described, the present invention provides an improved method for producing a chassis member usable for a chassis of an electronic device. The present invention is not limited to the description and drawings constituting part of the present disclosure. For example, although the 5×30 (H material or O material) is utilized as the chassis member in the embodiment, other materials may be used as long as the materials have controlled crystal grain sizes. Although the chassis member 100 is used as the lid 22 constituting the electronic device 14 in the above-mentioned example, the chassis member 100 may be used for the rear cover 12a and/or the front cover 12b. The chassis member 100 can be used as a chassis member of various types of electronic devices such as desktop PCs, tablet PCs, smartphones, and cellular phones.

While the invention has been particularly shown and described with reference to a preferred embodiment, it will be understood by those skilled in the art that various changes in form and detail may be made therein without departing from the spirit and scope of the invention.

What is claimed is:

1. A method, comprising:
   etching a surface of an aluminum alloy substrate, wherein said aluminum alloy substrate includes an aluminum alloy having a grain size between 40 μm and 50 μm inclusive;
   performing an alumite treatment on said surface of said aluminum alloy substrate to form an alumite layer on said surface of said aluminum alloy substrate;
   polishing said alumite layer; and
   utilizing said aluminum alloy substrate with said polished alumite layer as an outermost layer of a chassis member of an electronic device.

2. The method of claim 1, said method further includes performing press work on said aluminum alloy substrate before said etching, so that said aluminum alloy substrate conforms to a shape of said chassis member.

3. The method of claim 1, wherein said polishing is performed after said alumite treatment without a clear coating treatment.

4. The method of claim 1, wherein said etching is performed without sand blasting.

5. A method, comprising:
   conforming an aluminum alloy substrate to the shape of a chassis member, wherein said aluminum alloy substrate includes an aluminum alloy having a grain size between 40 μm and 50 μm inclusive;
   washing a surface of said aluminum alloy substrate;
   etching said aluminum alloy substrate;
   providing a satin finishing on said aluminum alloy substrate;
   forming an alumite layer on said surface of said aluminum alloy substrate; and
   utilizing said aluminum alloy substrate with said polished alumite layer as an outermost layer of a chassis member of an electronic device.

6. The method of claim 5, wherein said conforming further includes conforming said aluminum alloy substrate to the shape of a chassis member via press work.

7. The method of claim 5, wherein said washing further includes washing said aluminum alloy substrate with an alkalescent degreasing agent.

8. The method of claim 5, wherein said etching further includes
   etching said aluminum alloy substrate using an alkaline solution; and
   subsequently immersing said aluminum alloy substrate in an acid solution to neutralize said alkaline solution.

9. The method of claim 5, wherein said providing further includes immersing said aluminum alloy substrate in a make-up solution supplemented with an additive for said satin finishing.

10. The method of claim 5, wherein said method further includes polishing said alumite layer.

* * * * *